(12) United States Patent
Lee

(10) Patent No.: US 7,440,341 B2
(45) Date of Patent: Oct. 21, 2008

(54) SEMICONDUCTOR MEMORY DEVICE HAVING TRIMMED VOLTAGE GENERATOR AND METHOD OF GENERATING TRIMMED VOLTAGE IN SEMICONDUCTOR MEMORY DEVICE

(75) Inventor: Cheon-Oh Lee, Yongin-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 223 days.

(21) Appl. No.: 11/508,406

(22) Filed: Aug. 23, 2006

(65) Prior Publication Data
US 2007/0047334 A1    Mar. 1, 2007

(30) Foreign Application Priority Data
Aug. 25, 2005    (KR) ............. 10-2005-0078390

(51) Int. Cl.
G11C 11/34    (2006.01)
(52) U.S. Cl. .................. 365/189.09; 365/226
(58) Field of Classification Search ........... 365/189.09, 365/226
See application file for complete search history.

(56) References Cited

U.S. PATENT DOCUMENTS

| 5,426,616 A  | * | 6/1995 | Kajigaya et al. ........... 365/226 |
| 6,414,890 B2 | * | 7/2002 | Arimoto et al. ............ 365/201 |
| 6,512,715 B2 | * | 1/2003 | Okamoto et al. ........... 365/227 |

FOREIGN PATENT DOCUMENTS

| JP | 2003-288791 | 10/2003 |
| JP | 2004-200327 | 7/2004 |
| JP | 2004-260032 | 9/2004 |

* cited by examiner

Primary Examiner—Michael T Tran
(74) Attorney, Agent, or Firm—F. Chau & Assoc., LLC

(57) ABSTRACT

A semiconductor memory device including a trimmed voltage generator and a method of generating a trimmed voltage in the semiconductor memory device, in which the semiconductor memory device includes a voltage trimming unit, memory cell array, and a trimming current generator. The voltage trimming unit outputs a first trimming current control signal corresponding to a difference between a predetermined internal voltage and an external voltage supplied from outside of the semiconductor memory device in a trimming mode. The memory cell array stores the first trimming current control signal in the trimming mode and outputs a second trimming current control signal corresponding to the first trimming current control signal in a normal mode. The trimming current generator outputs a trimming current corresponding to the first trimming current control signal in the trimming mode and outputs a trimming current corresponding to the second trimming current control signal in the normal mode. The voltage trimming unit controls the internal voltage to be identical to the external voltage and outputs the controlled internal voltage as the trimmed voltage in response to the trimming current. The semiconductor memory device and the trimmed voltage generating method can output an accurate trimmed voltage without using a voltage supplied from outside in the normal operation.

34 Claims, 4 Drawing Sheets

SEMICONDUCTOR MEMORY DEVICE HAVING TRIMMED VOLTAGE GENERATOR AND METHOD OF GENERATING TRIMMED VOLTAGE IN SEMICONDUCTOR MEMORY DEVICE

CROSS-REFERENCE TO RELATED PATENT APPLICATION

This application claims the benefit of Korean Patent Application No. 10-2005-0078390, filed on Aug. 25, 2005, in the Korean Intellectual Property Office, the disclosure of which is incorporated herein in its entirety by reference.

BACKGROUND OF THE INVENTION

1. Technical Field

The present disclosure relates to a semiconductor memory device and, more particularly, to a semiconductor memory device including a trimmed voltage generator and a method of generating a trimmed voltage in the semiconductor memory device.

2. Discussion of the Related Art

To write data in a memory cell of a semiconductor memory device and read the data from the memory cell, an accurate operating voltage is required. Furthermore, it is important that the operating voltage is not affected by external factors, such as an operating temperature and a power supply voltage.

As the integration of the semiconductor memory device is increased, the semiconductor memory device generates operating voltages with various levels required for the internal operation thereof and uses them in order to reduce power consumption. To generate the operating voltages, the semiconductor memory device must be provided with an accurate reference voltage that is a basis of the operating voltages.

SUMMARY OF THE INVENTION

Exemplary embodiments of the present invention provide a semiconductor memory device capable of outputting an accurate trimmed voltage without receiving an external voltage from an external device in its actual operation by storing information of the accurate trimmed voltage in nonvolatile memory cells and trimming a voltage using a plurality of current sources.

An embodiment of the present invention provides a method of generating a trimmed voltage that stores information of an accurate trimmed voltage in nonvolatile memory cells and trims a voltage using a plurality of current sources, to thereby output the accurate trimmed voltage without using an external voltage.

According to an embodiment of the present invention, there is provided a semiconductor memory device generating an accurate trimmed voltage including a voltage trimming unit, a plurality of memory cells, and a trimming current generator. The voltage trimming unit outputs a first trimming current control signal corresponding to a difference between a predetermined internal voltage and an external voltage supplied from outside of the semiconductor memory device in a trimming mode. The memory cell array stores the first trimming current control signal in the trimming mode and outputs a second trimming current control signal corresponding to the first trimming current control signal in a normal mode. The trimming current generator outputs a trimming current corresponding to the first trimming current control signal in the trimming mode and outputs a trimming current corresponding to the second trimming current control signal in the normal mode. The voltage trimming unit controls the internal voltage so as to be identical to the external voltage and outputs the controlled internal voltage as the trimmed voltage in response to the trimming current.

In an exemplary embodiment of the invention, the memory cell array is a nonvolatile memory cell array. The voltage trimming unit includes a trimmed voltage output part and a control signal output part. The trimmed voltage output part outputs the internal voltage in the trimming mode, controls the internal voltage to be identical to the external voltage and outputs the controlled internal voltage as the trimmed voltage in response to the trimming current in the trimming mode and the normal mode. The control signal output part outputs the first trimming current control signal corresponding to the difference between the internal voltage and the external voltage in the trimming mode. The voltage trimming unit may also include an internal voltage output part generating the internal voltage and providing the generated internal voltage to the trimmed voltage output part.

In an exemplary embodiment of the invention, the trimming current generator includes a first subtrimming current generator and a second subtrimming current generator. The first subtrimming current generator provides the trimming current to the trimmed voltage output part if the internal voltage is smaller than the external voltage. The second subtrimming current generator extracts the trimming current from the trimmed voltage output part if the internal voltage is larger than the external voltage.

The first subtrimming current generator and the second subtrimming current generator respectively include a plurality of current generators. The plurality of current generators are connected in parallel and respectively generate currents in response to the first or second trimming current control signal. The plurality of current generators may be a plurality of transistors.

In an exemplary embodiment of the invention, the first subtrimming current generator or the second subtrimming current generator further comprises a plurality of switches serially connected to a plurality of transistors, respectively. The corresponding switches are respectively turned on or off in response to the first or second trimming current control signal such that current selectively flows in the corresponding transistors serially connected thereto.

According to an embodiment of the present invention, there is provided a semiconductor memory device generating an accurate trimmed voltage including a control signal output part, a plurality of nonvolatile memory cells, and a trimming unit.

The control signal output part outputs a first trimming current control signal corresponding to a difference between a predetermined internal voltage and an external voltage supplied from outside to the semiconductor memory device in a trimming mode. The control signal output part is not operated in a normal mode. The nonvolatile memory cell array stores the first trimming current control signal in the trimming mode and outputs a second trimming current control signal corresponding to the first trimming current control signal in the normal mode. The trimming unit controls the internal voltage to be identical to the external voltage and outputs the controlled internal voltage as the trimmed voltage in response to the first trimming current control signal in the trimming mode. The trimming unit controls the internal voltage to be identical to the external voltage and outputs the controlled internal voltage as the trimmed voltage in response to the second trimming current control signal in the normal mode, the external voltage of the normal mode is the external voltage supplied already in the trimming mode.

According to an embodiment of the present invention, there is provided a method of generating a trimmed voltage in a semiconductor memory device including a plurality of memory cells comprising: storing a first trimming current control signal in the plurality of memory cells; outputting a trimming current; and outputting the trimmed voltage.

The step of storing the first trimming current control signal in the plurality of memory cells stores the first trimming current control signal corresponding to a predetermined internal voltage and an external voltage supplied from outside to the semiconductor memory device in the memory cell array. The step of outputting the trimming current outputs the trimming current having a size corresponding to the first trimming current control signal stored in the memory cell array. The step of outputting the trimmed voltage controls the internal voltage to be identical to the external voltage and outputs the controlled internal voltage as the trimmed voltage in response to the trimming current.

BRIEF DESCRIPTION OF THE DRAWINGS

Exemplary embodiments of the present invention can be understood in more detail from the following descriptions taken in conjunction with the attached drawings in which.

DETAILED DESCRIPTION OF EXEMPLARY EMBODIMENTS

The present invention will now be described more fully with reference to the accompanying drawings, in which exemplary embodiments of the invention are shown.

Figure 1:
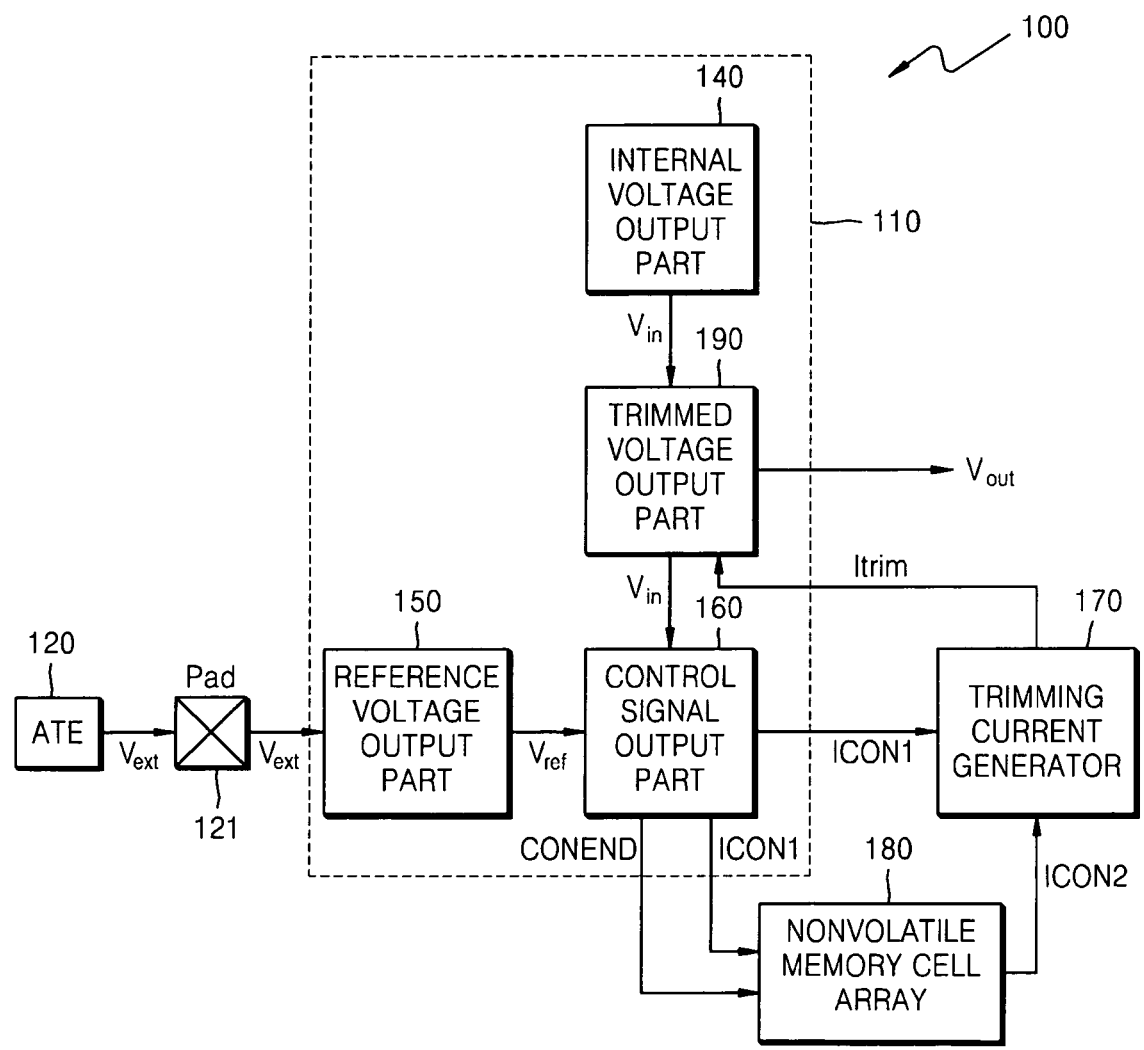
FIG. 1 is a block diagram of a semiconductor memory device having a trimmed voltage generator according to an embodiment of the present invention.

FIG. 1 is a block diagram of a semiconductor memory device 100 having a trimmed voltage generator according to an embodiment of the present invention. Referring to FIG. 1, the semiconductor memory device 100 includes a voltage trimming unit 110, a memory cell array 180 including a plurality of memory cells, and a trimming current generator 170. The memory cells may be nonvolatile memory cells, for example, flash memory cells.

Hereinafter, a trimming mode means a mode in which an external voltage Vext is applied to the semiconductor memory device from outside and a normal mode means a mode in which the external voltage Vext is not applied to the semiconductor memory device. Preferably, the external voltage Vext is supplied from an automated test equipment (ATE) 120 through a power adjuster 121.

In the trimming mode, the semiconductor memory device 100 receives the external voltage Vext and stores a first trimming current control signal ICON1 corresponding to a difference between an internal voltage Vin and the external voltage Vext in the memory cell array 180. In the normal mode, the semiconductor memory device 100 controls the internal voltage Vin to be equal to the external voltage Vext using the first trimming current control signal ICON1 stored in the memory cell array 180 and outputs the controlled internal voltage as a trimmed voltage Vout. The external voltage of the normal mode is the external voltage supplied already in the trimming mode. Therefore, in the normal mode, the semiconductor memory device 100 can output an accurate trimmed voltage without using an external voltage.

The voltage trimming unit 110 outputs the first trimming current control signal ICON1 corresponding to the difference between the predetermined internal voltage Vin and the external voltage Vext applied to the semiconductor memory device 100 from outside in the trimming mode.

The memory cell array 180 stores the first trimming current control signal ICON1 in the trimming mode and outputs a second trimming current control signal ICON2 corresponding to the first trimming current control signal ICON1 in the normal mode.

The trimming current generator 170 outputs a trimming current Itrim having a level corresponding to the first trimming current control signal ICON1 in the trimming mode and outputs the trimming current Itrim having a level corresponding to the second trimming current control signal ICON2 in the normal mode.

The voltage trimming unit 110 controls the internal voltage Vin to be equal to the external voltage Vext in response to the trimming current Itrim and outputs the controlled internal voltage Vin as the trimmed voltage Vout.

Returning to FIG. 1, the voltage trimming unit 110 includes an internal voltage output part 140, a reference voltage output part 150, a trimmed voltage output part 190, and a control signal output part 160. The internal voltage output part 140 outputs the predetermined internal voltage Vin in the trimming mode and the normal mode. The reference voltage output part 150 receives the external voltage Vext from the ATE 120 and outputs a reference voltage Vref in the trimming mode. The control signal output part 160 outputs the first trimming current control signal ICON1 corresponding to the difference between the reference voltage Vref and the internal voltage Vin in the trimming mode. The trimmed voltage output part 190 outputs the internal voltage Vin in the trimming mode and controls the internal voltage Vin to be equal to the external voltage Vext to output it as the trimmed voltage Vout in response to the trimming current Itrim in the trimming mode and in the normal mode.

Figure 2:
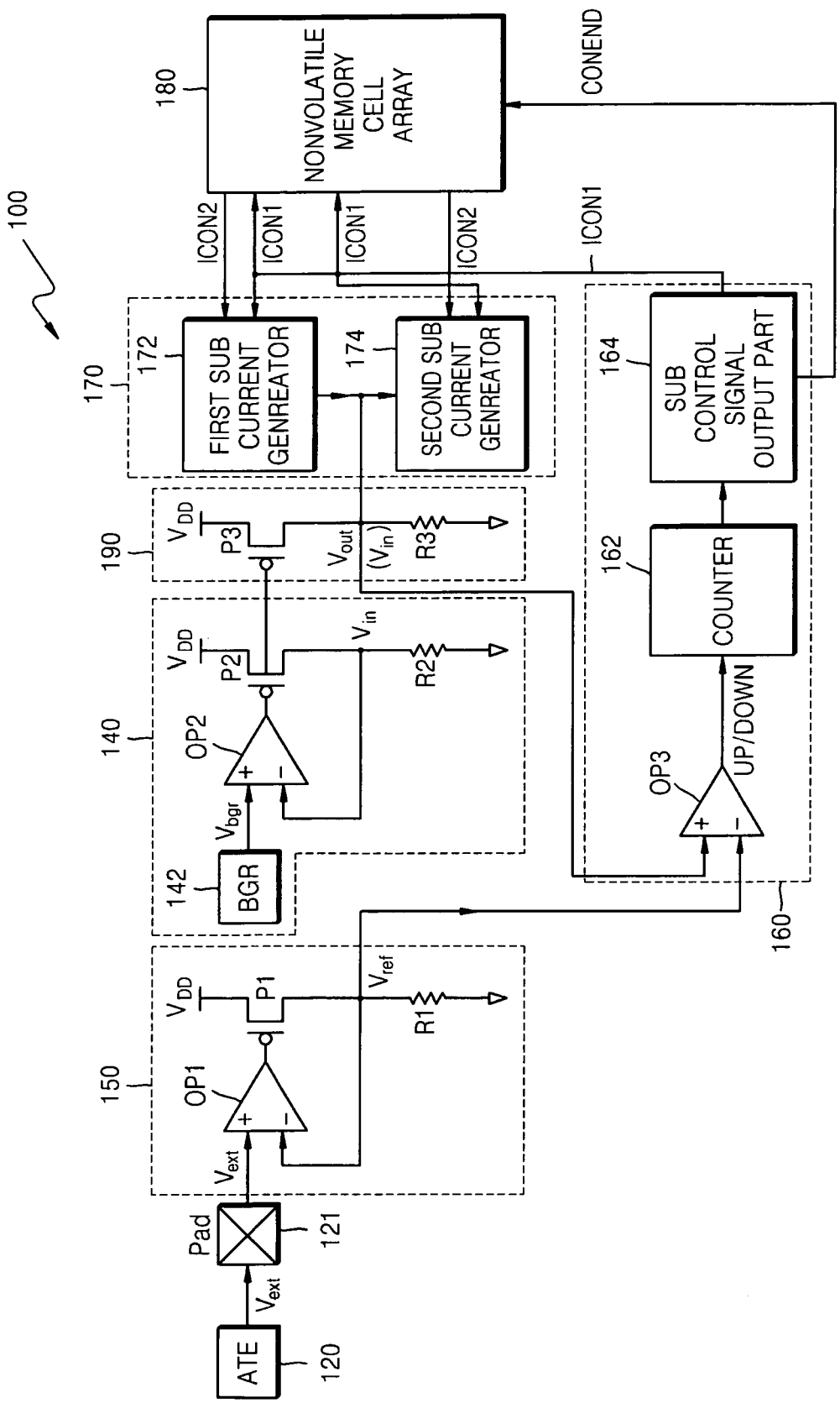
FIG. 2 is a circuit diagram showing the internal structure of the semiconductor memory device of FIG. 1 according to an embodiment of the present invention.

FIG. 2 is a circuit diagram showing the internal structure of the semiconductor memory device of FIG. 1 according to an exemplary embodiment of the present invention. Referring to FIG. 2, the reference voltage output part 150 includes a reference current generator P1, a reference resistor R1, and an operational amplifier OP1. The reference current generator P1 can be a PMOS transistor or an NMOS transistor.

The internal voltage output part 140 includes a band gap reference circuit 142, an internal current generator P2, an internal resistor R2 and an operational amplifier OP2. The internal current generator P2 can be a PMOS transistor or an NMOS transistor.

The trimmed voltage output part 190 includes a PMOS transistor P3 and a resistor R3. Preferably, the gate of the PMOS transistor P3 is coupled to the gate of the internal current generator P2 of the internal voltage output part 140. The resistor R3 can have the same resistance value as that of the internal resistor R2 of the internal voltage output part 140.

The control signal output part 160 includes an operational amplifier OP3, a counter 162, and a sub control signal output part 164. The trimming current generator 170 includes a first subtrimming current generator 172 and a second subtrimming current generator 174.

The operation of the semiconductor memory device 100 will now be explained with reference to FIG. 2. First of all, the operation of the semiconductor memory device 100 in the trimming mode is described.

The operational amplifier OP1 of the reference voltage output part 150 compares a reference voltage Vref applied to a node between the reference current generator P1 and the reference resistor R1 to the external voltage Vext supplied from the ATE 120 and outputs the comparison result to the gate of the reference current generator P1. The current flowing through the reference current generator P1 is varied with the voltage applied to the gate of the reference current generator P1, and thus the reference voltage Vref is adjusted such that it becomes identical to the external voltage Vext.

The band gap reference circuit 142 of the internal voltage output part 140 outputs a predetermined band gap reference voltage Vbgr. The operational amplifier OP2 compares the internal voltage Vin applied to the node between the internal current generator P2 and the internal resistor R2 to the band gap reference voltage Vbgr, and then outputs the comparison result to the gate of the internal current generator P2. The current flowing through the internal current generator P2 is varied with the voltage applied to the gate of the internal current generator P2, and thus the internal voltage Vin is controlled to be identical to the band gap reference voltage Vbgr.

The gate of the PMOS transistor P3 of the trimmed voltage output part 190 is coupled to the gate of the internal current generator P2 of the internal voltage output part 140. Thus, a current having the same size as the current flowing in the internal current generator P2 flows in the PMOS transistor P3. Furthermore, the value of the resistor R3 is identical to the value of the internal resistor R2 of the internal voltage output part 140, and thus the internal voltage Vin applied to a node between the PMOS transistor P3 and the resistor R3 has the same level as the internal voltage Vin applied to the node between the internal current generator P2 and the internal resistor R2.

That is, the trimmed voltage output part 190 outputs the internal voltage Vin identical to the internal voltage Vin of the internal voltage output part 140.

The operational amplifier OP3 of the control signal output part 160 compares the reference voltage Vref of the reference voltage output part 150 to the internal voltage Vin of the trimmed voltage output part 190 and outputs the comparison result as an up signal UP or a down signal DOWN. For example, the operational amplifier OP3 outputs the up signal UP when the internal voltage Vin is smaller than the reference voltage Vref and outputs the down signal DOWN when the internal voltage Vin is larger than the reference voltage Vref.

The counter 162 accumulates the up signal UP or down signal DOWN and outputs the accumulated sum as a digital value. That is, the output of the counter 162 corresponds to the difference between the reference voltage Vref and the internal voltage Vin.

The subcontrol signal output part 164 outputs the first trimming current control signal ICON1 having a value corresponding to the output value of the counter 162 to the first subtrimming current generator 172 and the second subtrimming current generator 174. The first subtrimming current generator 172 provides the trimming current Itrim to the trimmed voltage output part 190 when it receives the first trimming current control signal ICON1 corresponding to the up signal UP. Here, a current corresponding to the sum of the current of the PMOS transistor P2 and the trimming current Itrim flows in the resistor R3 of the trimmed voltage output part 190. Accordingly, the internal voltage Vin applied to the resistor R3 is increased by a value obtained by multiplying the trimming current Itrim by the value of the resistor R3.

The second subtrimming current generator 174 extracts the trimming current Itrim from the trimmed voltage output part 190 when it receives the first trimming current control signal ICON1 corresponding to the down signal DOWN. Here, a current corresponding to a value obtained by subtracting the trimming current Itrim from the current of the PMOS transistor P2 flows in the resistor R3 of the trimmed voltage output part 190. Accordingly, the internal voltage Vin applied to the resistor R3 is decreased by a value obtained by multiplying the trimming current Itrim by the value of the resistor R3.

The internal voltage Vin adjusted through the trimming process is input to the operational amplifier OP3 of the control signal output part 160 again and compared to the reference voltage Vref of the reference voltage output part 150 again. Then, the trimming process is carried out again to control the level of the internal voltage Vin.

That is, the aforementioned trimming process is repeated so that the internal voltage Vin is controlled to be identical to the reference voltage Vref, that is, the external voltage Vext, and output as the trimmed voltage Vout in the trimming mode.

When the trimming process is completed and the reference voltage Vref and the internal voltage Vin having the same level are input to the operational amplifier OP3 of the control signal output part 160, the subcontrol signal output part 164 outputs a trimming completion signal CONEND and outputs the first trimming current control signal ICON1 to the memory cell array 180. The memory cell array 180 stores the first trimming current control signal ICON1 at the instant of completing the trimming process in response to the trimming completion signal CONEND.

Next, the operation of the semiconductor memory device 100 according to an embodiment of the present invention in the normal mode will now be explained.

Preferably, the reference voltage output part 150 and the control signal output part 160 are not operated in the normal mode. In the normal mode, the memory cell array 180 outputs the second trimming current control signal ICON2 corresponding to the first trimming current control signal ICON1 stored therein in the trimming mode. Preferably, the second trimming current control signal ICON2 has the same value as the first trimming current control signal ICON1. As described above, the first trimming current control signal ICON1 has the value corresponding to the difference between the reference voltage Vref, that is, the external voltage Vext, and the internal voltage Vin. Thus, the second trimming current control signal ICON2 also has the value corresponding to the difference between the reference voltage Vref, that is, the external voltage Vext, and the internal voltage Vin.

The first subtrimming current generator 172 provides the trimming current Itrim to the trimmed voltage output part 190 in response to the second trimming current control signal ICON2. The second subtrimming current generator 174 extracts the trimming current Itrim from the trimmed voltage output part 190 in response to the second trimming current control signal.

The internal voltage output part 140 outputs the internal voltage Vin having the same level as the band gap reference voltage Vbgr. The trimmed voltage output part 190 outputs the internal voltage Vin having the same level as the internal voltage Vin of the internal voltage output part 140. The process of outputting the internal voltage Vin from the internal voltage output part 140 and the trimmed voltage output part 190 is similar to the aforementioned process of outputting the internal voltage Vin in the trimming mode, so that a detailed explanation therefor is omitted.

The trimmed voltage output part 190 adjusts the internal voltage Vin such that the internal voltage Vin has the same level as the external voltage Vext that was input in the trimming mode in response to the trimming current Itrim and outputs the adjusted internal voltage Vin as the trimmed voltage Vout. The process of outputting the trimmed voltage Vout from the trimmed voltage output part 190 in response to the trimming current Itrim is similar to the aforementioned process of outputting the trimmed voltage Vout in the trimming mode, so that a detailed explanation therefor is omitted. However, in the normal mode, the trimmed voltage Vout is output in response to the second trimming current control signal ICON2 stored in the memory cell array 180. Accordingly, in the normal mode, the accurate trimmed voltage Vout can be output without using the external voltage Vext.

Figure 3:
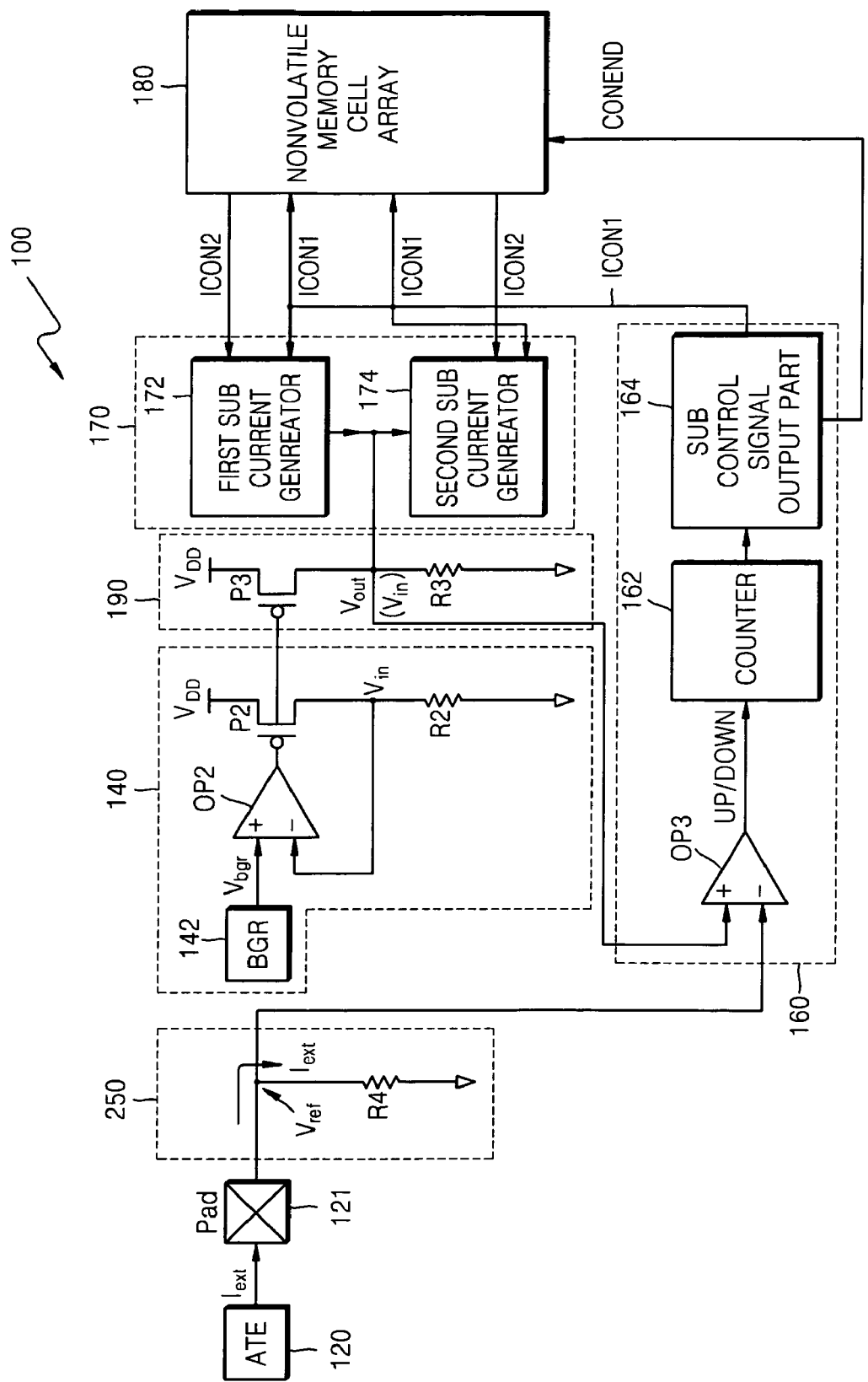
FIG. 3 is a circuit diagram showing the internal structure of the semiconductor memory device of FIG. 1 according to an embodiment of the present invention.

FIG. 3 is a circuit diagram showing the internal structure of the semiconductor memory device of FIG. 1 according to an exemplary embodiment of the present invention. Referring to FIG. 3, a reference voltage output part 250 includes a reference resistor R4. In the trimming mode, the reference voltage output part 250 flows an external current Iext provided by the ATE 120 through the reference resistor R4. In this case, a reference voltage Vext corresponding to a value obtained by multiplying the external current Iext by the value of the reference resistor R4 is applied to the reference resistor R4. The reference voltage output part 250 outputs the reference voltage Vref to the control signal output part 160.

That is, the reference voltage output part 250 of FIG. 3 receives the external current Iext from the ATE 120 and outputs the reference voltage Vref, whereas the reference voltage output part 150 of FIG. 2 receives the external voltage Vext from the ATE 120 and outputs the reference voltage Vref identical to the external voltage Vext.

The internal structure of the semiconductor memory device of FIG. 3 is similar to the internal structure of the semiconductor memory device of FIG. 2 in terms of components and operation. Thus, those skilled in the art can understand the internal structure of the semiconductor memory device of FIG. 3 from the aforementioned explanation of FIG. 2, so that a detailed explanation therefor is omitted.

Figure 4:
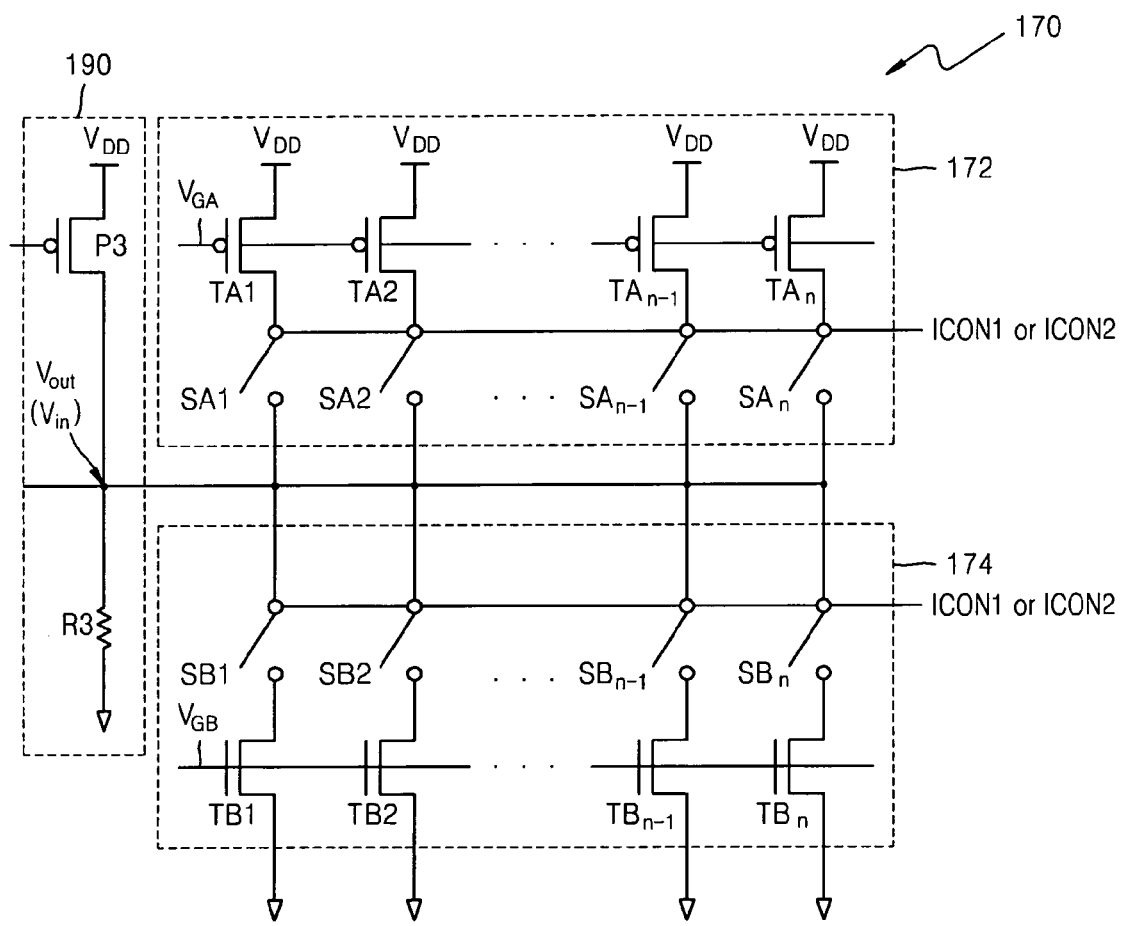
FIG. 4 is a circuit diagram of the trimming current generator of FIGS. 2 and 3.

FIG. 4 is a circuit diagram of the trimming current generator 170 of FIGS. 2 and 3. Referring to FIG. 4, the first subtrimming current generator 172 of the trimming current generator 170 includes a plurality of transistors TA1 through TAn and a plurality of switches SA1 through SAn serially connected to the plurality of transistors TA1 through TAn, respectively. The second subtrimming current generator 174 includes a plurality of transistors TB1 through TBn and a plurality of switches SB1 through SBn serially connected to the plurality of transistors TB1 through TBn, respectively. The transistors TA1 through TAn can have different width/length (W/L) ratios from one another. And the transistors TB1 through TBn can have different width/length (W/L) ratios from one another.

The gates of the transistors TA1 through TAn and TB1 through TBn are provided with a first gate voltage $V_{GA}$ or a second gate voltage $V_{GB}$. The first gate voltage $V_{GA}$ and the second gate voltage $V_{GB}$ have voltage ranges allowing currents capable of forming the trimming current Itrim to flow through the transistors TA1 through TAn and TB1 through TBn.

A case where the internal voltage Vin is smaller than the reference voltage Vref, that is, the trimming current generator 170 provides the trimming current Itrim to the trimmed voltage output part 190, will now be explained.

In the trimming mode, the first subtrimming current generator 172 respectively turns on or off the plurality of switches SA1 through SAn in response to the first trimming current control signal ICON1 such that current selectively flows through the transistors TA1 through TAn respectively coupled to the switches SA1 through San. In the normal mode, the first subtrimming current generator 172 turns on or off the transistors TA1 through TAn such that current selectively flows through the transistors TA1 through TAn in response to the second trimming current control signal ICON2.

That is, the first subtrimming current generator 172 respectively turns on or off part of the switches SA1 through SAn in response to the first trimming current control signal ICON1 or the second trimming current control signal ICON2 to control current to flow through part of the transistors TA1 through TAn, and then sums up currents flowing in the transistors TA1 through TAn to output the summed current as the trimming current Itrim. The second subtrimming current generator 174 turns off all the switches SB1 through SBn in response to the first trimming current control signal ICON1 or the second trimming current control signal ICON2 such that a current does not flow in any of the transistors TB1 through TBn.

A case where the internal voltage Vin is larger than the reference voltage Vref, that is, the trimming current generator 170 extracts the trimming current Itrim from the trimming voltage output part 190, will now be explained.

The first subtrimming current generator 172 turns off all the switches SA1 through SAn in response to the first trimming current control signal ICON1 or the second trimming current control signal ICON2, such that a current does not flow in any of the transistors TA1 through TAn. The second subtrimming current generator 174 respectively turns on or off part of the switches SB1 through SBn in response to the first trimming current control signal ICON1 or the second trimming current control signal ICON2 to control current to flow through part of the transistors TB1 through TBn, and extracts the trimming current Itrim corresponding to the sum of the currents flowing in the transistors TB1 through TBn from the trimmed voltage output part 190.

Since the plurality of transistors TA1 through TAn and TB1 through TBn have different width/length (W/L) ratios, they respectively have currents having different sizes flowing therein. Accordingly, the first and second subtrimming current generators 172 and 174 can output or extract the more accurate trimming current Itrim. Therefore, the trimmed voltage output part 190 can control the internal voltage Vin to be perfectly identical to the external voltage Vext.

A semiconductor memory device according to the exemplary embodiment of the present invention includes a control signal output part 160, memory cell array 180 and a trimming part 170, 190. The control signal output part 160 outputs the first trimming current control signal ICON1 corresponding to the difference between the predetermined internal voltage Vin and the external voltage Vext supplied from outside of the semiconductor memory device in the trimming mode. The control signal output part 160 is not operated in the normal mode.

The memory cell array 180 stores the first trimming current control signal ICON1 in the trimming mode and outputs the second trimming current control signal ICON2 corresponding to the first trimming current control signal ICON1 in the normal mode.

The trimming part 170, 190 controls the internal voltage Vin to be identical to the external voltage Vext in response to the first trimming current control signal ICON1 and outputs the controlled internal voltage Vin as the trimmed voltage Vout in the trimming mode. In the normal mode, the trimming part 170, 190 controls the internal voltage Vin to be identical to the external voltage Vext and outputs the adjusted voltage as the trimmed voltage Vout in response to the second trimming current control signal ICON2, and the external voltage of the normal mode is the external voltage supplied already in the trimming mode. The trimming part 170, 190 can include a trimming current generator 190 and a trimmed voltage output part 170. The trimming current generator 190 outputs the trimming current Itrim corresponding to the first trimming current control signal ICON1 in the trimming mode and outputs the trimming current Itrim corresponding to the second trimming current control signal ICON2 in the normal mode.

The trimmed voltage output part 170 outputs the internal voltage Vin to the control signal output part 160 in the trimming mode, controls the internal voltage Vin to be identical to the external voltage Vext in response to the trimming current Itrim, and outputs the controlled voltage as the trimmed voltage Vout in the trimming mode and in the normal mode.

The technical spirit of the semiconductor memory device according to the exemplary embodiment of the present invention is identical to that of the above-described semiconductor memory device 100 and the operation thereof corresponds to the operation of the semiconductor memory device 100. Accordingly, those skilled in the art can understand the semiconductor memory device according to the exemplary embodiment of the present invention from the above explanation, so that the detailed explanation therefor is omitted.

A method for generating an accurate trimmed voltage in the semiconductor memory device according to an exemplary embodiment of the present invention includes a step of storing a first trimming current control signal in a memory cell array, a step of outputting a trimming current, and a step of outputting a trimmed voltage.

The step of storing the first trimming current control signal in the memory cell array stores the first trimming current control signal corresponding to the difference between a predetermined internal voltage and an external voltage applied by an external device in the memory cell array. The step of outputting the trimming current outputs the trimming current corresponding to the first trimming current control signal stored in the memory cell array. The step of outputting the trimmed voltage controls the internal voltage to be identical to the external voltage and outputs the controlled voltage as the trimmed voltage.

The method for generating a trimmed voltage according to the exemplary embodiment of the present invention carries out only the step of outputting the trimming current and the step of outputting the trimmed voltage in the normal mode.

The technical spirit of the trimmed voltage generating method according to the exemplary embodiment of the present invention is identical to that of the above-described semiconductor memory device 100 and corresponds to the operation of the semiconductor memory device 100. Accordingly, those skilled in the art can understand the trimmed voltage generating method according to the exemplary embodiment of the present invention from the above explanation so that the detailed explanation therefor is omitted.

As described above, the semiconductor memory device and the method for generating a trimmed voltage in the semiconductor memory device can output an accurate trimmed voltage without using an external voltage in the actual operation.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor memory device generating an accurate trimmed voltage comprising:
a voltage trimming unit outputting a first trimming current control signal corresponding to a difference between a predetermined internal voltage and an external voltage supplied from outside of the semiconductor memory device in a trimming mode;
a memory cell array storing the first trimming current control signal in the trimming mode and outputting a second trimming current control signal corresponding to the first trimming current control signal in a normal mode; and
a trimming current generator outputting a trimming current corresponding to the first trimming current control signal in the trimming mode and outputting a trimming current corresponding to the second trimming current control signal in the normal mode,
wherein the voltage trimming unit controls the internal voltage to be identical to the external voltage and outputs the controlled internal voltage as the trimmed voltage in response to the trimming current.

2. The semiconductor memory device of claim 1, wherein the memory cell array comprises a nonvolatile memory cell array.

3. The semiconductor memory device of claim 1, wherein the voltage trimming unit comprises:
a trimmed voltage output part outputting the internal voltage in the trimming mode, controlling the internal voltage to be identical to the external voltage and outputting the controlled internal voltage as the trimmed voltage in response to the trimming current in the trimming mode and the normal mode; and
a control signal output part outputting the first trimming current control signal corresponding to the difference between the internal voltage and the external voltage in the trimming mode.

4. The semiconductor memory device of claim 3, wherein the voltage trimming unit further comprises an internal voltage output part generating the internal voltage and providing the generated internal voltage to the trimmed voltage output part.

5. The semiconductor memory device of claim 4, wherein the trimming current generator comprises:
a first subtrimming current generator providing the trimming current to the trimmed voltage output part if the internal voltage is smaller than the external voltage; and
a second subtrimming current generator extracting the trimming current from the trimmed voltage output part if the internal voltage is larger than the external voltage.

6. The semiconductor memory device of claim 5, wherein the first subtrimming current generator and the second subtrimming current generator respectively include a plurality of current generators that are connected in parallel and respectively generate currents in response to the first or second trimming current control signal.

7. The semiconductor memory device of claim 6, wherein the plurality of current generators are a plurality of transistors.

8. The semiconductor memory device of claim 7, wherein the first subtrimming current generator or the second subtrimming current generator further comprises a plurality of switches serially connected to the corresponding plurality of transistors, respectively, the plurality of switches being respectively turned on or off in response to the first or second trimming current control signal such that current either flows in the corresponding transistors serially connected thereto or not.

9. The semiconductor memory device of claim 8, wherein the plurality of transistors have different respective length/width (W/L) ratios.

10. The semiconductor memory device of claim 4, wherein the control signal output part outputs a trimming completion signal to the nonvolatile memory cell array when the internal voltage has been controlled to be identical to the external voltage, and the nonvolatile memory cell array stores the first trimming current control signal in response to the trimming completion signal.

11. The semiconductor memory device of claim 4, further comprising a reference voltage output part including a reference current generator generating a predetermined reference current, a reference resistor serially connected to the reference current generator, and a comparator outputting a difference between the voltage of a node between the reference current generator and the reference resistor and the external voltage supplied from an automated test equipment,
wherein the reference current generator generates the reference current having a size corresponding to an output of the comparator, and the reference voltage output part controls the voltage of the node between the reference current generator and the reference resistor to be identical to the external voltage and outputs the controlled voltage to the control signal output part.

12. The semiconductor memory device of claim 4, further comprising a reference voltage output part including a reference resistor, flowing an external current supplied from an automated test equipment through the reference resistor, and outputting a voltage of the reference resistor to the control signal output part.

13. The semiconductor memory device of claim 1, wherein the trimming mode is a mode in which a predetermined external voltage is applied to the semiconductor memory device from outside, and the normal mode is a mode in which the external voltage is not applied to the semiconductor memory device.

14. The semiconductor memory device of claim 1, wherein the first trimming current control signal and the second trimming current control signal have the same value.

15. A semiconductor memory device generating an accurate trimmed voltage comprising:
a control signal output part outputting a first trimming current control signal corresponding to a difference between a predetermined internal voltage and an external voltage supplied from outside to the semiconductor memory device in a trimming mode, the control signal output part not being operated in a normal mode;
a nonvolatile memory cell array storing the first trimming current control signal in the trimming mode and outputting a second trimming current control signal corresponding to the first trimming current control signal in the normal mode; and
a trimming unit controlling the internal voltage to be identical to the external voltage and outputting the controlled internal voltage as the trimmed voltage in response to the first trimming current control signal in the trimming mode, and controlling the internal voltage to be identical to the external voltage and outputting the controlled internal voltage as the trimmed voltage in response to the second trimming current control signal in the normal mode, wherein the external voltage of the normal mode is the external voltage supplied already in the trimming mode.

16. The semiconductor memory device of claim 15, wherein the trimming unit comprises:
a trimming current generator outputting a trimming current corresponding to the first trimming current control signal in the trimming mode and outputting a trimming current corresponding to the second trimming current control signal in the normal mode; and
a trimmed voltage output part outputting the internal voltage to the control signal output part in the trimming mode and controlling the internal voltage to be identical to the external voltage and outputting the controlled internal voltage as the trimmed voltage in response to the trimming current in the trimming mode and in the normal mode.

17. The semiconductor memory device of claim 16, further comprising an internal voltage output part generating the internal voltage and providing the internal voltage to the trimmed voltage output part.

18. The semiconductor memory device of claim 17, wherein the trimming current generator comprises:
a first subtrimming current generator providing the trimming current to the trimmed voltage output part if the internal voltage is smaller than the external voltage; and
a second subtrimming current generator extracting the trimming current from the trimmed voltage output part if the internal voltage is larger than the external voltage.

19. The semiconductor memory device of claim 18, wherein the first subtrimming current generator and the second subtrimming current generator respectively include a plurality of current generators that are connected in parallel and respectively generate currents in response to the first or second trimming current control signal.

20. The semiconductor memory device of claim 19, wherein the plurality of current generators are a plurality of transistors.

21. The semiconductor memory device of claim 20, wherein the first subtrimming current generator or the second subtrimming current generator further comprises a plurality of switches serially connected to the corresponding plurality of transistors, respectively, the plurality of switches being respectively turned on or off in response to the first or second trimming current control signal such that current either flows in the corresponding transistors serially connected thereto or not.

22. The semiconductor memory device of claim 21, wherein the plurality of transistors have different respective length/width (W/L) ratios.

23. The semiconductor memory device of claim 17, wherein the control signal output part outputs a trimming completion signal to the nonvolatile memory cell array when the internal voltage has been controlled to be identical to the external voltage, and the nonvolatile memory cell array stores the first trimming current control signal in response to the trimming completion signal.

24. The semiconductor memory device of claim 17, wherein the control signal output part comprises a reference voltage output part including a reference current generator generating a predetermined reference current, a reference resistor serially connected to the reference current generator, and a comparator outputting a difference between the voltage of a node between the reference current generator and the reference resistor and the external voltage supplied from an automated test equipment,
wherein the reference current generator generates the reference current having a level corresponding to the output of the comparator, and the reference voltage output part controls the voltage of the node between the reference current generator and the reference resistor to be identical to the external voltage and outputs the controlled voltage to the control signal output part.

25. The semiconductor memory device of claim 15, wherein the trimming mode is a mode in which a predetermined external voltage is applied to the semiconductor memory device from an external device, and the normal mode is a mode in which the external voltage is not applied to the semiconductor memory device.

26. The semiconductor memory device of claim 15, wherein the first trimming current control signal and the second trimming current control signal have the same value.

27. A method of generating a trimmed voltage in a semiconductor memory device including a memory cell array comprising:
storing a first trimming current control signal corresponding to a predetermined internal voltage and an external voltage supplied to the semiconductor memory device in the memory cell array;
outputting a trimming current having a size corresponding to the first trimming current control signal stored in the memory cell array; and
controlling the internal voltage to be identical to the external voltage and outputting the controlled internal voltage as the trimmed voltage in response to the trimming current.

28. The method of claim 27, wherein only outputting the trimming current and outputting the controlled internal voltage as the trimmed voltage are performed in a normal mode in which the external voltage is not applied to the semiconductor memory device.

29. The method of claim 27, wherein the memory cell array comprises a nonvolatile memory cell array.

30. The method of claim 29, further comprising generating the predetermined internal voltage.

31. The method of claim 30, wherein outputting the trimming current comprises:
providing the trimming current to a trimmed voltage output part if the internal voltage is smaller than the external voltage; and
extracting the trimming current from the trimmed voltage output part if the internal voltage is larger than the external voltage.

32. The method of claim 31, wherein providing the trimming current or extracting the trimming current comprises:
generating a plurality of currents in response to the first trimming current control signal; and
summing up the plurality of currents and outputting the summed current as the trimming current.

33. The method of claim 32, wherein generating the plurality of currents generates currents having different respective levels.

34. The method of claim 29, wherein storing the first trimming current control signal in the nonvolatile memory cell array comprises:
outputting a trimming completion signal to the nonvolatile memory cell array when the internal voltage has been controlled to be identical to the external voltage; and
storing the first trimming current control signal in the nonvolatile memory cell array in response to the trimming completion signal.

* * * * *